US010486418B2

(12) United States Patent
Stefani et al.

(10) Patent No.: US 10,486,418 B2
(45) Date of Patent: Nov. 26, 2019

(54) ACTUATING DEVICE, PARTICULARLY FOR INK-JET PRINTHEADS, WITH ELECTROMAGNETIC ISOLATION

(71) Applicant: SYSTEM S.P.A., Fiorano Modenese (Modena) (IT)

(72) Inventors: Franco Stefani, Sassuolo (IT); Mohamed Ouassif, Varana Serramazzoni (IT)

(73) Assignee: SYSTEM S.P.A., Fiorano Modenese (IT)

( * ) Notice: Subject to any disclaimer, the term of this patent is extended or adjusted under 35 U.S.C. 154(b) by 69 days.

(21) Appl. No.: 15/579,756

(22) PCT Filed: Jul. 5, 2016

(86) PCT No.: PCT/IB2016/054025
§ 371 (c)(1),
(2) Date: Dec. 5, 2017

(87) PCT Pub. No.: WO2017/006245
PCT Pub. Date: Jan. 12, 2017

(65) Prior Publication Data

US 2018/0178505 A1 Jun. 28, 2018

(30) Foreign Application Priority Data

Jul. 8, 2015 (IT) ........................ 102015000031664

(51) Int. Cl.
*H01F 3/00* (2006.01)
*B41J 2/045* (2006.01)
(Continued)

(52) U.S. Cl.
CPC ................ *B41J 2/045* (2013.01); *H01F 7/16* (2013.01); *B41J 2002/041* (2013.01)

(58) Field of Classification Search
CPC ...... B05C 5/02; B08B 3/00; B41J 2/14; B41J 2002/04; B41J 2002/05; B42J 2/035;
(Continued)

(56) References Cited

U.S. PATENT DOCUMENTS 2,369,296 A * 2/1945 Irwin ..................... H01H 50/60 335/124
3,715,694 A * 2/1973 Kruger ................... H01H 3/222 335/100
(Continued)

FOREIGN PATENT DOCUMENTS

WO 03069201 A1 8/2003
WO WO 2004/048112 A1 * 6/2004 ................ B41J 2/18
WO 2012058373 A2 5/2012

*Primary Examiner* — Shawki S Ismail
*Assistant Examiner* — Lisa N Homza
(74) *Attorney, Agent, or Firm* — Pearne & Gordon LLP

(57) ABSTRACT

An actuator device, particularly for ink-jet heads, comprising: two or more electromagnetic actuators or solenoids (S), each comprising a ferromagnetic core (2), and a conductive winding or coil (4), arranged concentrically to the ferromagnetic core (2); a containment body (5), which encloses the electromagnetic actuators (S); an insulator element (1) for each solenoid (S). Each insulator element (1) is made of a magnetic material and is disposed at least partially in proximity of a respective solenoid (S).

5 Claims, 3 Drawing Sheets

(51) Int. Cl.
*H01F 7/16* (2006.01)
*B41J 2/04* (2006.01)

(58) Field of Classification Search
CPC ....... B42J 2/04; B42J 2/045; B42J 2/14; B42J 2/06; B42J 2/155; B42J 2/285
USPC .......................................................... 335/261
See application file for complete search history.

(56) References Cited

U.S. PATENT DOCUMENTS

| | | | | |
|---|---|---|---|---|
| 4,345,225 | A * | 8/1982 | Lemmer | H01H 50/02 335/132 |
| 5,784,083 | A | 7/1998 | Schumann et al. | |
| 7,864,006 | B2 * | 1/2011 | Foster | H01H 59/0009 200/181 |
| 7,866,796 | B2 | 1/2011 | Horsnell et al. | |
| 8,466,760 | B2 * | 6/2013 | Foster | B81C 1/0023 200/181 |
| 8,820,871 | B2 | 9/2014 | Wallsten et al. | |
| 9,108,424 | B2 | 8/2015 | Wallsten et al. | |
| 9,676,184 | B2 | 6/2017 | Wallsten et al. | |
| 2002/0025260 | A1 * | 2/2002 | Maruyama | F04B 17/003 417/322 |
| 2005/0231553 | A1 * | 10/2005 | Horsnell | F16K 31/0644 347/47 |
| 2008/0278268 | A1 * | 11/2008 | Foster | B81C 1/00333 335/78 |
| 2010/0132612 | A1 * | 6/2010 | Achrainer | B05B 1/3053 118/696 |
| 2010/0170918 | A1 | 7/2010 | Achrainer | |
| 2010/0194504 | A1 * | 8/2010 | Goubely | H01F 7/081 335/260 |
| 2012/0105522 | A1 | 5/2012 | Wallsten et al. | |
| 2014/0354739 | A1 | 12/2014 | Wallsten et al. | |
| 2016/0185111 | A1 | 6/2016 | Wallsten et al. | |

* cited by examiner

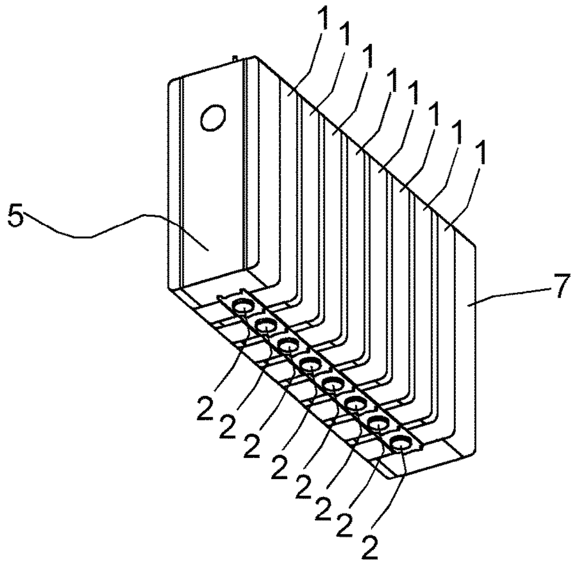
Fig.1
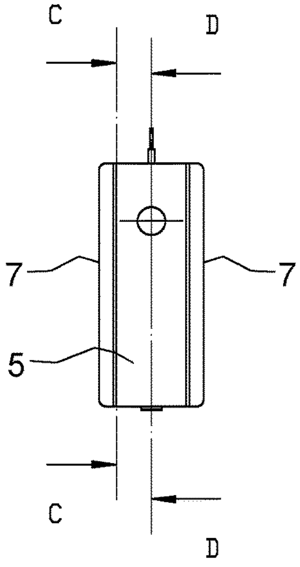
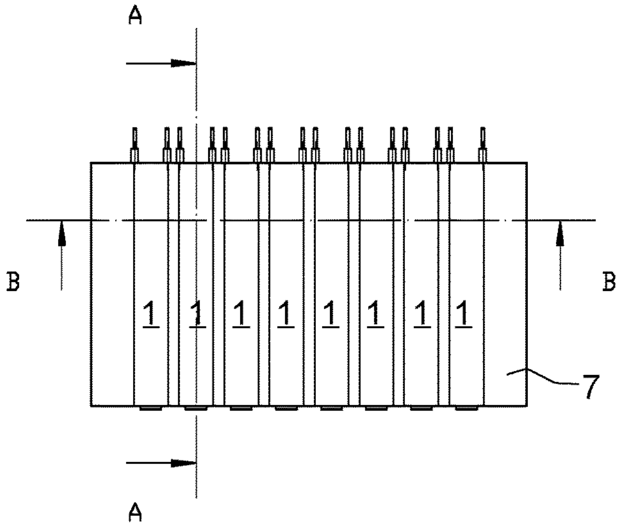
Fig.1a
Fig.1b

ACTUATING DEVICE, PARTICULARLY FOR INK-JET PRINTHEADS, WITH ELECTROMAGNETIC ISOLATION

FIELD OF THE INVENTION

An actuating device, particularly for ink-jet printheads, constitutes the object of the present invention.

DESCRIPTION OF RELATED ART

The ink-jet printheads, in particular those destined to the decoration of ceramic tiles, comprise a plurality of actuator devices that have the function to control opening and closing of the individual nozzles intended for ejecting glaze, in order that the ejection of glaze droplets needed to obtain the desired decoration, can be accurately controlled.

An actuator device typically comprises a plurality of identical solenoids that are arranged parallel to one another and side by side on a common middle plane. Each solenoid comprises a ferromagnetic core inserted concentrically in the coil, the feeding of which allows to produce an electromagnetic field that causes the displacement of the core between at least two extreme positions. In the two extreme positions of the core, there are generally defined an open position and a closed position of a printhead nozzle.

The electromagnetic fields produced by the solenoids interfere with each other, thereby producing unwanted induction of the closest solenoids. This goes to the detriment of the proper control of the individual solenoids which tend to be influenced by control signals received by the proximate solenoids. To reduce the mutual interference between the solenoids, it is necessary to maintain a certain distance therebetween, whereby the overall size of the actuator device is increased.

Furthermore, in the known actuator devices, rather high temperatures are produced that contribute to the deterioration of the performance of individual solenoids.

OBJECTS OF THE INVENTION

The object of the present invention is to provide an actuator device, in particular but not exclusively for an ink-jet printhead, which allows to overcome the drawbacks of the currently available devices. An advantage of the actuator device according to the present invention is that it allows to consistently reduce the mutual electromagnetic interference between the various solenoids.

A further advantage of the actuator device according to the present invention is that it allows to consistently reduce the working temperature of individual solenoids.

BRIEF DESCRIPTION OF THE DRAWINGS

Further characteristics and advantages of the present invention will better emerge from the detailed description that follows of a preferred embodiment of the invention, illustrated by way of non-limiting example in the accompanying figures in which:

FIG. 1 shows an overall schematic view of the actuator device according to the present invention;

FIGS. 1*a* and 1*b* show two views in vertical elevation of the actuator device of FIG. 1;

DETAILED DESCRIPTION OF PREFERRED EMBODIMENTS OF THE INVENTION

Figure 2:
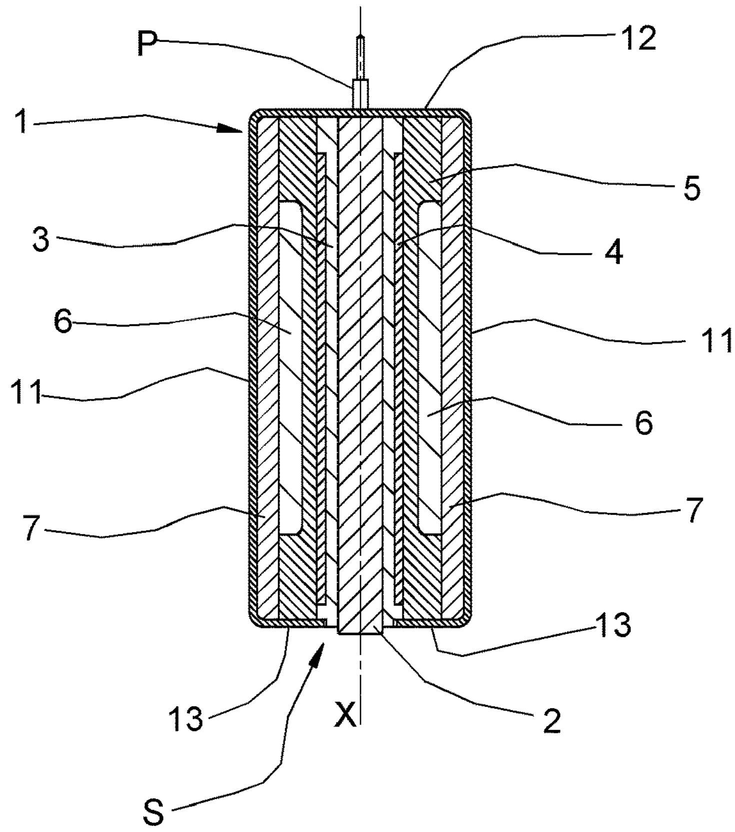
FIG. 2 shows a view in section on the plane A-A of FIG. 1*b;*

The actuator device according to the present invention comprises two or more solenoids (S), each comprising a coil (4) that is wound in a cylindrical spiral about a longitudinal axis (X). Each coil can be fed via a connector (P) shown in FIG. 2.

Each solenoid (S) includes a ferromagnetic core (2), inserted concentrically in the respective coil (4). The ferromagnetic core (2), preferably of a cylindrical shape, is subject to a force that tends to move it along the longitudinal axis (X) by effect of the electromagnetic field produced by the coil (4), and in turn produces a magnetic field. In the preferred embodiment of the actuator device according to the present invention, the core (2) is held stationary and exploits the magnetic field for actuating in movement a shutter element (not shown) of a printhead nozzle. In other embodiments, the coil (2) may instead be movable along the longitudinal axis (X) between at least a first and a second working position, by effect of the controlled electrical feeding of the coil (4). The coil (4) is wound about a tubular-shaped spool (3), internally of which the core (2) is placed. The longitudinal axis (X) of the core (2) coincides substantially with the longitudinal axis (X) of the coil (4) and the spool (3).

In the preferred use of the actuator device for the control of an ink-jet printhead, each core (2) then acts, with its own magnetic field, on a shutter of a printhead nozzle. The electric feeding of the coil (4) causes, by way of example, an opening condition of a printhead nozzle, whereas non-feeding of the coil (4) leads to a closing condition thereof.

In the embodiment shown, the actuator device comprises eight solenoids (S) aligned along a same mean plane (T). Of course the number of solenoids (S) may vary.

The solenoids (S) are parallel to each other, i.e. the longitudinal axes (X) of the coils (4) are parallel to one another. Preferably the solenoids (S) are equal to one another.

The solenoids (S) are inserted into a containment body (5). In particular, each solenoid (S) is inserted in the respective cavity which is formed within the containment body (5). These cavities are open at the ends thereof, both for allowing insertion of the solenoids (S), and for allowing the cores (2) to protrude outside of the containment body (5), in order to control the displacement of a respective printhead shutter or another member.

The actuator device comprises an insulator element (1) for each solenoid (S). Each insulator element (1) is made of a magnetic material and extends at least partially in the vicinity or by side of a respective solenoid (S). An example of a suitable material for obtaining insulators elements, is permalloy.

The use of an insulator element (1) for each solenoid (S) can greatly reduce the interference between the coils (4) of the various solenoids (S). This enables to reduce the distance between the solenoids (S), by reducing the size of the actuator device. Additionally, the use of an insulator element (1) for each solenoid (S) allows to also reduce interference between the two adjacent actuators devices, thereby allowing to reduce the distance therebetween.

In the preferred embodiment of the actuator device, each insulator element (1) comprises two parallel and opposed longitudinal portions (11). The two longitudinal portions (11) are joined together by a transverse portion (12). As shown in FIG. 2, each insulator element (1) is basically U-shaped. The preferred conformation of the insulator elements (1) maximizes the beneficial shielding effects with respect to electromagnetic fields generated by each solenoid (S), thus reducing in a consistent manner interference between the solenoids (S). The longitudinal portions (11) preferably comprise an end portion (13) that is oriented perpendicularly to the longitudinal axis (X) and terminates near the core (2).

Preferably each solenoid (S) is placed in the space between the longitudinal portions (11) of the respective insulator element (1). In particular, the insulator elements (1) are arranged outside of the containment body (5). Furthermore, the insulator elements (1) are shaped such that the longitudinal portions (11) are situated at a pre-determined distance from the respective solenoid (S). This distance may be chosen according to the characteristics of the electromagnetic field generated by the solenoids (S), in order to reduce as much as possible interference between the solenoids (S) themselves.

Preferably each insulator element (1) is further shaped so that the electromagnetic core (2) of the respective solenoid (S) is arranged at a pre-determined distance from the transverse portion (12), at least at one of its ends. This allows to further reduce the mutual interference between the solenoids (S).

The container body (5) is preferably provided with at least one cooling conduit (6), within which a cooling fluid can be made to flow. Such a cooling conduit (6) is formed on an outer lateral surface of the containment body (5). Preferably the conduit (6) is delimited, at least partly, by an outer cover (7) sealingly connected to the outer lateral surface of the container body (5). Alternatively the conduit (6) may be obtained entirely within the containment body (5), so as to lap the solenoids (S) without communicating with the same. The cooling conduit (6) basically extends between two planes parallel to the mean plane (T) and laps the compartments in which the solenoids (S) are inserted internally of the containment body (5).

Figure 3:
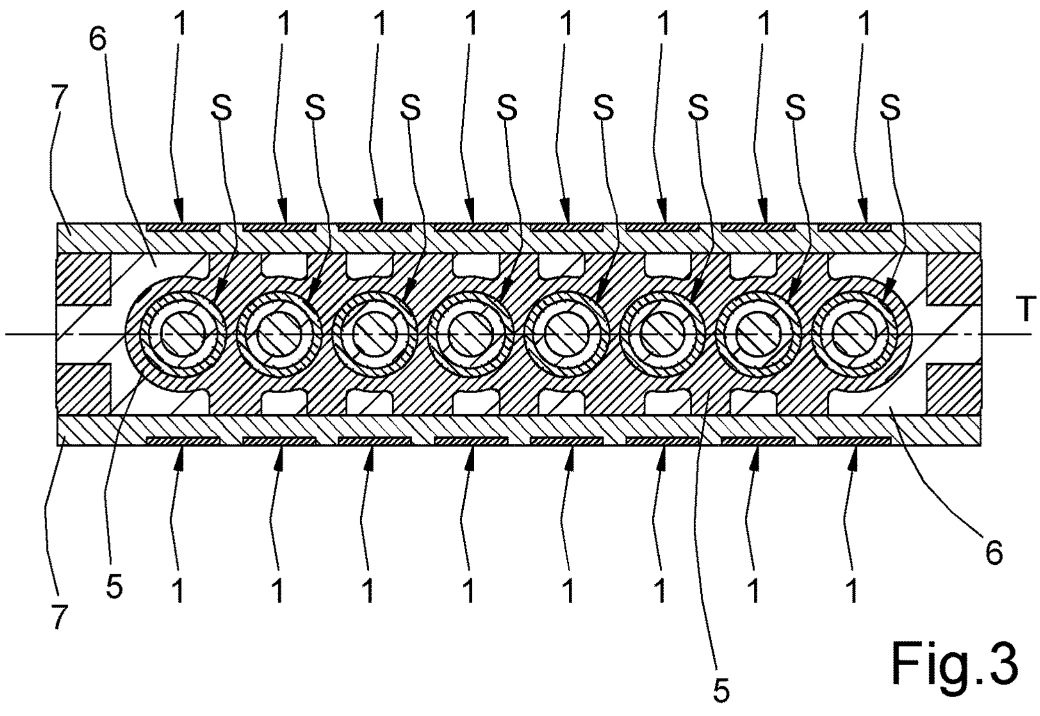
FIG. 3 shows a sectional view according to the plane B-B of FIG. 1*b;*
Figure 4:
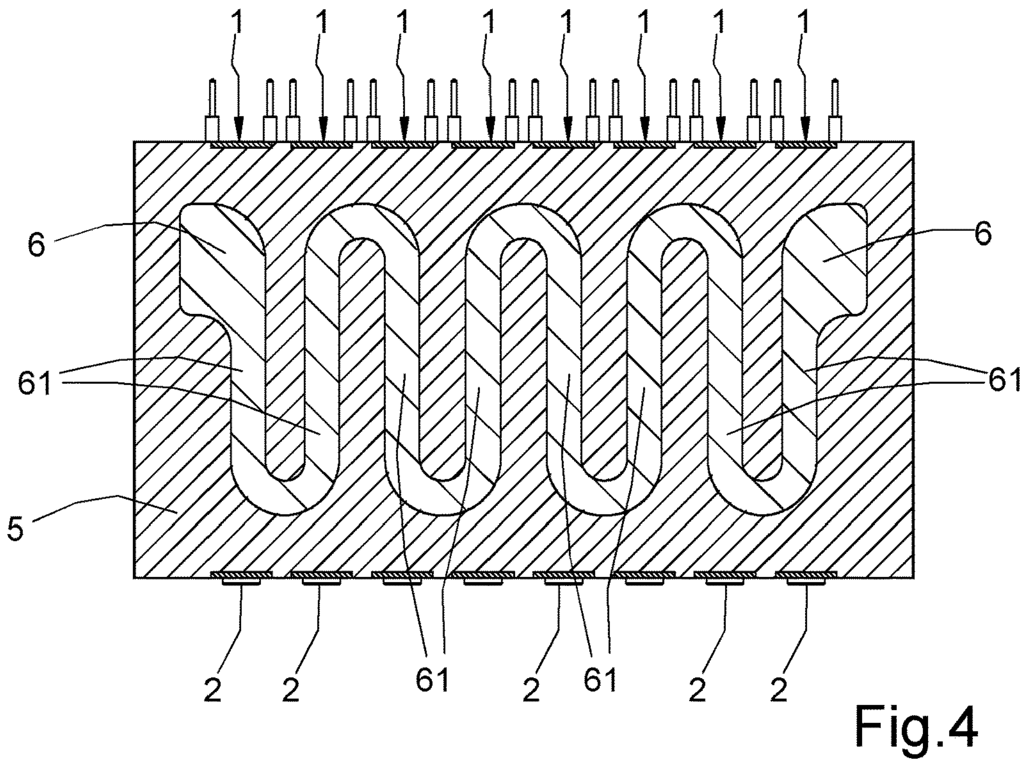
FIG. 4 shows a view in section along the C-C plane of FIG. 1*a;*
Figure 5:
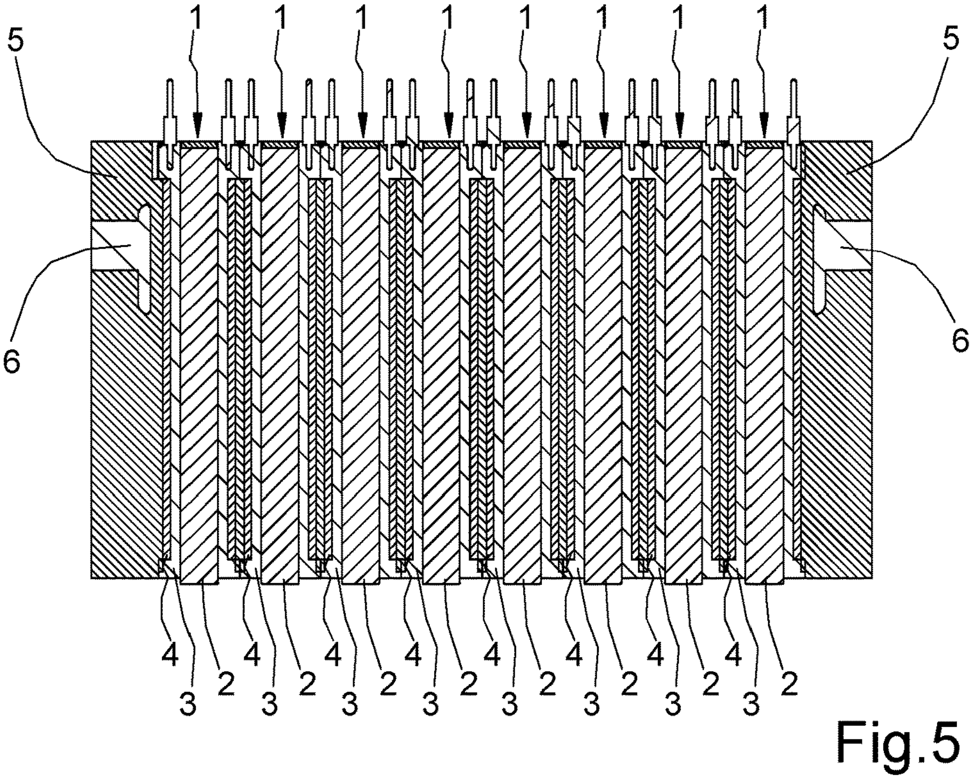
FIG. 5 shows a view in section on the plane D-D of FIG. 1*a.*

As shown in FIGS. 2,3,4, the conduit (6) laps the solenoids (S) outside of the containment body (5). In the preferred embodiment the conduit (6) exhibits a development with opposing lugs, with rectilinear portions (61) being parallel to the solenoid (S). In the preferred embodiment the actuator device comprises two conduits (6) arranged at two opposite side surfaces of the containment body (5), on opposite sides of the solenoids (S), each delimited by an outer cover (7). Preferably, the two conduits (6) are connected at their ends to a common inlet conduit and to a common outlet conduit, but may alternatively be provided with independent feeding and outlet. Preferably each insulator element (1) is disposed outside of the outer covers (7).

The presence of the conduit or of the cooling conduits (6) allows to drastically reduce the temperature of the solenoids (S), keeping it well below the temperatures at which the operation of the devices currently available occurs. This allows to improve performance and accuracy of each solenoid (S).

The invention claimed is:

1. An actuating device, particularly for ink-jet printheads, comprising:

two or more solenoids (S), each comprising a coil (4) and a ferromagnetic core (2) which is inserted concentrically within the coil (4);

a containment body (5), for containing the solenoids (S);

an insulator element (1) for each solenoid (S); each insulator element (1) is made of a magnetic material and extends at least partially in proximity of a corresponding solenoid (S);

wherein each insulator element (1) comprises two longitudinal portions (11) parallel and opposed one to another;

wherein each solenoid (S) is placed within the space between the longitudinal portions (11) of the respective insulator element (1); and wherein the longitudinal portions (11) are arranged at a pre-determined distance from the corresponding solenoid (S).

2. An actuating device according to claim 1, wherein the containment body (5) is provided with at least one cooling conduit (6).

3. An actuating device according to claim 2, wherein the cooling conduit (6) is formed on an outer lateral surface of the containment body (5) and is delimited at least partially by an outer cover (7).

4. An actuating device according to claim 3, wherein each insulator element (1) is arranged outside the outer cover (7).

5. An actuating device according to claim 1, wherein the containment body (5) is provided with at least one cooling conduit (6) that laps the solenoids (S).

* * * * *